United States Patent [19]

Contolini et al.

[11] Patent Number: 5,486,234
[45] Date of Patent: Jan. 23, 1996

US005486234A

[54] REMOVAL OF FIELD AND EMBEDDED METAL BY SPIN SPRAY ETCHING

[75] Inventors: Robert J. Contolini, Pleasanton; Steven T. Mayer, San Leandro; Lisa A. Tarte, Livermore, all of Calif.

[73] Assignee: The United States of America as represented by The United States Department of Energy, Washington, D.C.

[21] Appl. No.: 375,054

[22] Filed: Jan. 19, 1995

Related U.S. Application Data

[63] Continuation of Ser. No. 92,090, Jul. 16, 1993, abandoned.

[51] Int. Cl.$^6$ ................................. H01L 21/00
[52] U.S. Cl. ................................. 216/91
[58] Field of Search ................. 437/198, 195; 257/762; 156/640, 666, 664, 345, 639; 216/38, 52

[56] References Cited

U.S. PATENT DOCUMENTS

| | | | |
|---|---|---|---|
| 3,772,104 | 11/1973 | Chandross et al. | 156/18 |
| 3,773,577 | 11/1973 | Shibasaki | 156/8 |
| 4,317,698 | 3/1982 | Christol | 156/626 |
| 4,799,993 | 1/1989 | Hagan | 156/644 |
| 4,904,339 | 2/1990 | Diehl | 156/640 |
| 4,936,950 | 6/1990 | Doan | 156/644 |
| 4,944,836 | 7/1990 | Beyer | 156/645 |
| 4,976,810 | 12/1990 | Masuda | 156/659.1 |
| 5,002,627 | 5/1991 | Scheithauer | 156/345 |

FOREIGN PATENT DOCUMENTS

| | | | |
|---|---|---|---|
| 0117446 | 6/1986 | Japan | 437/198 |
| 476914 | 7/1990 | Japan | 156/640 |

OTHER PUBLICATIONS

Hoffman, IBM Technical Disclosure Bulletin, vol. 2, No. 6 Apr. 1960.

Primary Examiner—Robert Kunemund
Assistant Examiner—Joni Y. Chang
Attorney, Agent, or Firm—Henry P. Sartorio; L. E. Carnahan; William R. Moser

[57] ABSTRACT

A process of removing both the field metal, such as copper, and a metal, such as copper, embedded into a dielectric or substrate at substantially the same rate by dripping or spraying a suitable metal etchant onto a spinning wafer to etch the metal evenly on the entire surface of the wafer. By this process the field metal is etched away completely while etching of the metal inside patterned features in the dielectric at the same or a lesser rate. This process is dependent on the type of chemical etchant used, the concentration and the temperature of the solution, and also the rate of spin speed of the wafer during the etching. The process substantially reduces the metal removal time compared to mechanical polishing, for example, and can be carried out using significantly less expensive equipment.

20 Claims, 2 Drawing Sheets

REMOVAL OF FIELD AND EMBEDDED METAL BY SPIN SPRAY ETCHING

The United States Government has rights in this invention pursuant to Contract No. W-7405-ENG-48 between the United States Department of Energy and the University of California for the operation of Lawrence Livermore National Laboratory. This is a continuation of application Ser. No. 08/092,090 filed Jul. 16, 1993 now abandoned.

BACKGROUND OF THE INVENTION

The present invention is directed to removing material from a substrate or another layer of metal having one or more thin films formed on a substrate, specifically to a method for removing such material using spray (wet) etching, and more specifically to a process of removing both the field metal and the metal embedded in a substrate at substantially the same rate so as to leave a planar surface.

In the evolution of technology related to microelectronics, the use of metal conductive thin films formed on a substrate and the use of circuit patterns formed on or in vias (holes) of a substrate has become increasingly important. Numerous approaches have been developed for the fabrication of thin film assemblies for semi-conductors, printed circuits, etc. In the formation of such thin film assemblies various techniques have been developed to form circuit patterns, etc., either on an outer surface of a substrate or by grooves or vias in the substrate, and remove undesired material from substrate.

Generally, the removal of the undesired materials has been accomplished by placing masking material over the desired pattern and removing the undesired material by etching techniques. As a result, various etching processes and apparatus have been developed, as exemplified by U.S. Pat. Nos. 3,772,104 issued Nov. 13, 1973 to E. A. Chandross et al.; 4,317,698 issued Mar. 2, 1982 to J. T. Christol et al.; 4,700,993 issued Jan. 24, 1989 to E. F. Hagan; 4,976,810 issued Dec. 11, 1990 to S. Masuda et al.; and 5,002,627 issued Mar. 26, 1991 to A. Scheithauer et al.

In addition to the etching techniques for material removal, substantial efforts have been directed to mechanical, chemical, electrochemical, and chemical/mechanical polishing techniques. In many applications it is necessary to remove both the field metal and metal embedded in a substrate or in another layer of material formed on a substrate. For example, in the fabrication of planarized multi-level metal on a semiconductor substrate, it is desirable to remove both the field metal and the embedded circuit metal to produce a planar surface. Prior aprroaches producing the desired planar surfaces have been primarily directed to polishing techniques, or combinations of sputtering/ion milling, or other dry processes which are expensive, time consuming, and not satisfactory. An example of such a prior approach to forming desired planar surfaces is illustrated by the chem-mech polishing method of U.S. Pat. No. 4,944,836 issued Jul. 31, 1990 to K. D. Beyer et al.

While these prior polishing techniques, such as chemical-mechanical polishing (CMP) provided by above-referenced U.S. Pat. No. 4,944,836, has provided a technique for removal of copper, for example, and has produced substantially planar surfaces, a CMP process is very expensive to carry out (machine cost of $1,000,000.00), requires 5–10 minutes to remove one (1) micron of copper, and leaves the surface of the substrate (dielectric) not fully planar. Thus, there is a need for a more effective method of removing material from a substrate so as to provide a more planar surface on both the substrate and any circuit(s) embedded therein, and which is more cost effective as to equipment and time. The present invention fills that need by a spin-spray etching process for removing both the field metal and the embedded metal at substantially the same rate so as to leave a planar surface on both the metal pattern and the substrate (dielectric), and in a more cost effective manner.

SUMMARY OF THE INVENTION

It is an object of the present invention to provide a spin-spray etching process.

A further object of the invention is to provide a process for removing metal from a rotating substrate or from a layer of metal deposited thereon by spray or drip etching.

A further object of the invention is to provide a process for removing both the field .metal and the metal embedded in a substrate at substantially the same rate.

Another object of the invention is to remove metal from a substrate by a process which involves spraying a suitable metal etchant of appropriate concentration and temperature onto a substrate spinning at an appropriate speed to etch the metal evenly in order to leave a planar surface.

Another object of the invention is to provide a spin-spray etching process for removing metal from a substrate so as to leave a planar surface with little pattern remaining above the surface of the substrate.

Another object of the invention is to provide a process for removing copper from the surface of the substrate and for removing copper embedded into the metal surface and/or the substrate at substantially the same rate so as to produce a planar surface.

Other objects and advantages of the invention will become readily apparent from the following description and accompanying drawings. Basically, the invention involves a spin-spray etching process for simultaneous removal of field metal and embedded metal at substantially the same rate. More specifically, the process of this invention involves spraying a suitable copper etchant of appropriate concentration and temperature onto a spinning substrate, having a thin copper coating and a copper pattern, for example, embedded in the substrate, to etch the copper evenly everywhere.

BRIEF DESCRIPTION OF THE DRAWINGS

The accompanying drawings, which are incorporated into and form a part of the disclosure, illustrate embodiments produced by the invention and, together with the description, serve to explain the principles of the invention.

DETAILED DESCRIPTION OF THE INVENTION

Figure 1:
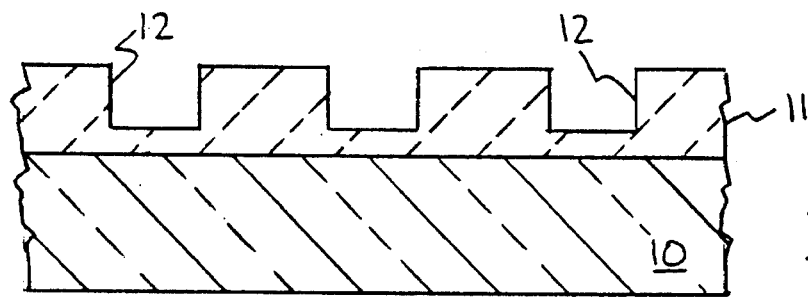
FIGS. 1–5 are cross-sectional views illustrating the fabrication of an embedded circuit pattern on a substrate and the removal of field and circuit metal in accordance with present invention.

The invention is directed to a process for removing metal from a substrate and embedded circuit pattern or metal layer and embedded circuit pattern, so as to leave a planar surface with essentially no pattern remaining above the surface of the substrate or the metal layer. Specifically, the invention involves a spin-spray (wet) etching process for removal of metal such that the embedded portions and field portions of a substrate or dielectric etch at substantially the same rate. More specifically, the invention involves a process or method of removing both the field copper and the copper embedded into a dielectric or substrate at substantially the same rate. The process involves spraying or dripping a suitable metal etchant of appropriate concentration and temperature onto a spinning substrate or wafer rotating at an appropriate RPM in order to etch the metal evenly everywhere. In certain applications, the substrate or wafer contains embedded metal which fills up previously patterned trenches and vias (holes) several microns deep in the surface of the substrate. In addition, metal between 0.1 to 1.0 micron thick is covering the field regions between patterned features. By this invention, the field metal can be etched away completely without significant etching of the metal inside the patterned features, and producing a substantially planar surface.

It is to be understood that for each different metal etched by the spin-spray process, a different metal etchant and/or concentration, temperature, and rotation speed is required. The following example, for explaining the principles of the invention and for carrying out an application of the spin-spray etching process of the invention, is directed toward the removal of copper as the field and embedded metal. However, the invention is not to be limited only to the removal of copper. A principle feature of this invention is that it does not make use of any masks on the field metal, embedded metal pattern, or substrate, and is much less time consuming and requires less expensive equipment than the prior known etching and/or polishing techniques and dry processes.

The success of the process of this invention is very dependent on the type of chemical etchant used, the concentrate and the temperature of the etching solution, and also the rate of spin speed of the substrate or wafer during etching. In tests conducted for the removable of copper using the process outlined hereinafter 0.5 microns of copper was removed from the field while only 0.5 microns or less of copper was removed from the patterned features. The entire spin-spray etching operation took less than 10 minutes, whereas conventional seed removal operations employing costly vacuum equipment take 2 to 3 times as long, and physical polishing operations take at least as long.

By way of comparison, to remove the last 1.0 micron of copper from the field and patterned features, the chemical-mechanical polishing (CMP) process uses equipment costing about $1,000,000.00 and leaves the surface of the dielectric non-planar, while the chemical spin-spray process leaves the dielectric untouched and the equipment costs only about $100,000.00. Thus, it has been experimentally verified that that process of this invention can be carried out in substantially less time with much less expensive equipment, while producing a planar surface with the field and patterned metal being removal at substantially the same rate.

Figure 2:
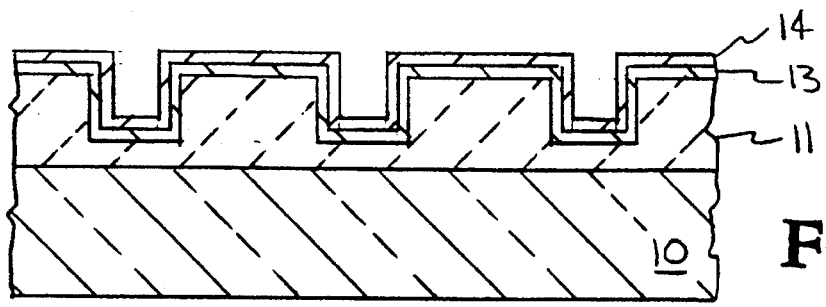
Figure 3:
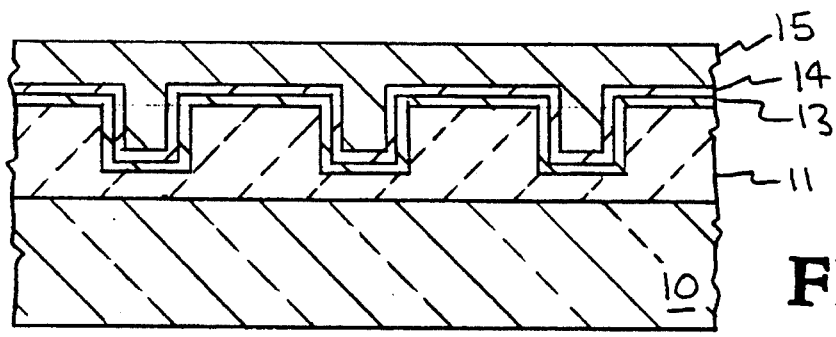
Figure 4:
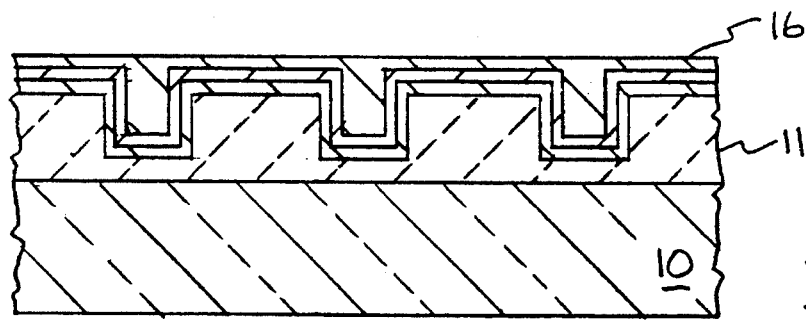
Figure 5:
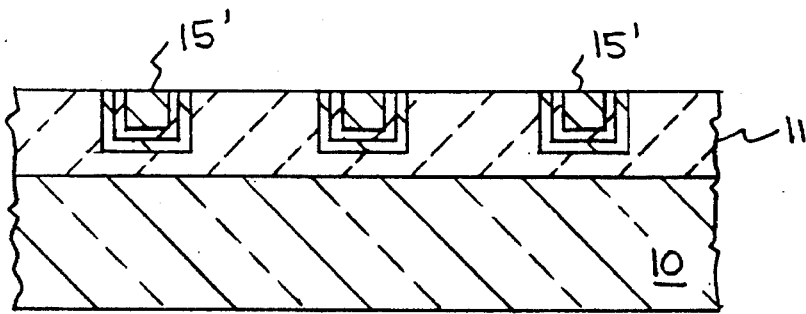

FIGS. 1–3 illustrate an embedded conductor fabrication process, with FIGS. 4 and 5 illustrating the removal of undesired metal of the FIG. 3 embedded conductor, and with FIG. 5 illustrating the result of the spray etching process of the present invention. As illustrated in FIGS. 1–5, and as seen in FIG. 1, a wafer or substrate 10 of silicon, for example, is provided with a layer 11 of plasma oxide in which trenches 12 are formed. As seen in FIG. 2, the surface of layer 11 and trenches 12 are coated with a layer 13 of titanium (Ti), for example, and a layer 14 of seed metal, such as copper, on which is deposited, such as by electroplating, a layer 15 of metal, such as copper, which covers the surface area and the trenches forming a circuit pattern in the trenches, as shown in FIG. 3. The major portion of the metal layer 15 is removed by electropolishing, such as by the technique of above-referenced U.S. Pat. No. 4,944,836, leaving a thin layer 16 of field metal copper, seed metal, and Ti) having a thickness of about one (1) micron, as seen in FIG. 4. The thus processed wafer or substrate 10 is then placed in a spray etcher station, such as illustrated in FIG. 2, and the remaining 1 micron thick layer 16 is removed by the spin spray etching process described hereinafter, such that the layer 16 of field metal and substantially the same amount of copper from the circuit pattern 15' trenches 12 is removed as illustrated in FIG. 5, leaving a planar surface on the plasma oxide coated wafer or substrate 10, as seen in FIG. 5.

Figure 6:
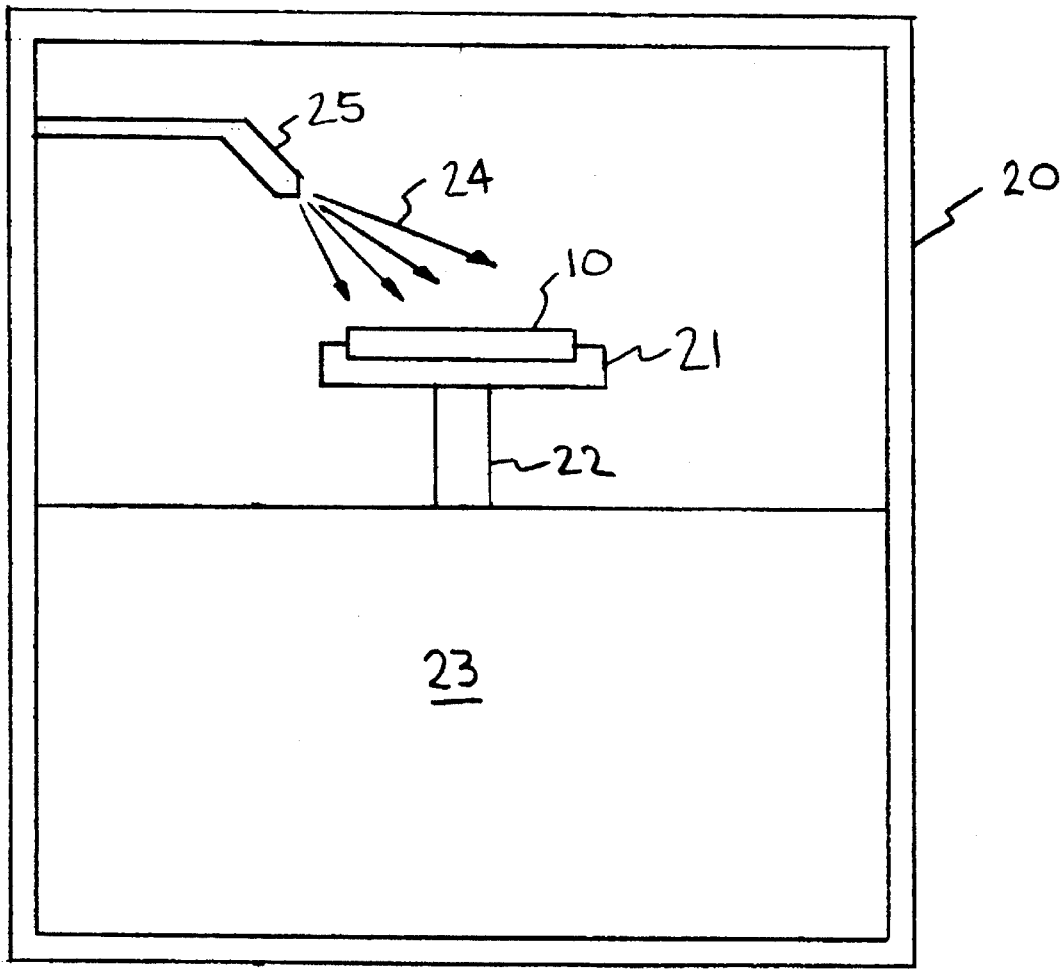
FIG. 6 is a schematic illustration of a typical spray etcher station utilized in the spray etching process of the present invention.

The spin spray etching process exemplified hereinafter is carried in the apparatus of FIG. 6, for example, which in simplified form includes an enclosure 20 having positioned therein, a sample mount or platform 21 connected by a shaft 22 to a controllable rotating mechanism generally indicated at 23, with a sample (wafer or substrate) 10 located on mount 21, onto which is sprayed an etchant 24 from a nozzle assembly 25 connected to an etchant supply and spray assembly, not shown.

While the following examples of the spin spray etching technique are directed to the removal of copper as the field and circuit pattern removal, the spray or wet etching technique can be utilized for other metals, such as gold, nickel, tungsten, titanium, chromium, silver, lead, and tin, as well as various alloys of these metals. It is to be understood that the etchant composition, as well as the temperature and spin rate need be determined for each type of metal being etched by the spin spray technique.

By way of example, for removal of copper, an etchant of 35% nitric acid solution at room temperature was directed onto the center of the sample or substrate at the rate of 0.75 ml/min. with the sample rotating at speeds between 90 to 250 RPM. Initially, the etchant was dropped onto the center of the sample, which produced an etch rate of 200–2500 Å/min. The best results, of the initial experimental tests, in terms of ratio of field copper etching to trench (circuit pattern) etching rates occured using the 35% nitric acid solution at room temperature, sample rotation speed of 2000 RPM, etchant deposit rate of 0.75 ml/min. (dropping rate of about 1 drop/4 secs. or 15 drops/min.). This resulted in a field copper etch rate of about 200 Å/min. and a trench etch rate of about 100 Å min. Thus, with field copper 1 micron thick to start with, the field copper was removed while removing about a ½ micron depth of copper in the patterned trench regions. During these experimental tests, the pattern trench sizes were 5.5 microns deep, 6–20 microns wide, and many mm long.

In further verification of the present spin spray etching process, other copper etching experiments were done with 10 to 55 grams/liter of ammonium persulfate at temperatures of 25°, 40° and 55° C. The etching was done with spin speeds from about 300 to 1900 RPM. Copper field etch rates varied from 1200 Å/min. to 13,400 Å/min. The best conditions of etching, which achieved about a 1:1 etch ratio between the field copper and the trench copper were: spin speed of 1930 RPM, 55 g/l ammonium sulfate, etch rates of 5600–6400 Å/min. at 25° C. The spray of solution onto the sample was at about 0.1 liter/min.

It has been determined that the angle of the spray is of utmost importance for proper uniformity. If the spray is touching an edge or the dead center of the substrate, it will etch those areas completely before the remaining metal has completed etching, thus resulting in poor uniformity of the etch.

For proper spray etching the spray must directly fan over the substrate and be centered on the substrate. In the tests conducted, for best results, the approximate distance of the opening tip of the spray nozzle to the surface of a 10 cm diameter substrate was approximately 8 cm, with the spray touching approximately 5 cm on the central region of the substrate. The solution (etchant) was sprayed over the entire 5 cm central region. The substrate RPM was 1,930 and the etch rate was approximately 5600 Å/min. in the above-described verification experiments.

It has thus been shown that the present invention provides a technique by which both the field metal and the circuit pattern (trench) metal can be readily removed at substantially the same rate by spin spray (wet) etching. While the above examples of the process have been directed to the removal of copper, the invention is not so limited, provided the etchant, temperature and rotation speeds are established for the specific metal or alloy to be removed by the spin spray etching process.

While particular embodiments, examples, materials and parameters have been set forth to provide an explanation of the invention, such is not intended to limit the scope of the invention. Modifications and changes will become apparent to those skilled in the art, and it is intended that the invention be limited only by the scope of the appended claims.

We claim:

1. A process for uniformly removing metal from a metal surface located on a substrate surface and from a metal surface located above metal containing trenches formed in the substrate for producing an essentially planar surface across the substrate and the metal containing trenches therein, comprising:

providing an etchant capable of etching the metal;
   rotating the substrate; and
   directing the etchant onto the metal surfaces.

2. The process of claim 1, wherein the etchant is maintained at a temperature in the range of about 25° C. to about 55° C.

3. The process of claim 2, additionally including the step of forming the metal on the substrate surface and above the trenches so as to include an outer layer of copper.

4. The process of claim 3, wherein the step of providing the etchant includes selecting an etchant from the group consisting of a nitric acid solution, and an ammonium persulfate solution.

5. The process of claim 4, wherein the temperature of the etchant is maintained at a temperature selected from the group of 25° C., 40° C., and 55° C.

6. The process of claim 5, wherein the substrate is rotated at a speed in the range of about 90 RPM to about 2000 RPM.

7. The process of claim 6, wherein the metal surface and metal above the trenches is removed at a rate of 200–13,400 Å/minute.

8. The process of claim 4, wherein the etchant is a 35% nitric acid solution maintained at room temperature of 25° C.

9. The process of claim 4, wherein the etchant is a solution containing 10 to 55 grams/liter of ammonium persulfate and maintained at a temperature in the range of 25° C. to 55° C.

10. A spin-spray process for removing copper from a field and from above embedded trenches for producing an essentially planar surface, comprising:

rotating a substrate containing the field and the embedded trenches;
    directing an etchant capable of etching copper onto the center of the substrate; and
    maintaining the temperature of the etchant in the range of 25° C. to 55° C.

11. The process of claim 10, wherein the step of rotating the substrate is carried out at a speed in the range of about 90 RPM to about 2000 RPM.

12. The process of claim 10, additionally including the step of forming the etchant from the group of nitric acid solution and ammonium persulfate solution.

13. The process of claim 12, wherein the etchant is formed from a 35% nitric acid solution at room temperature of 25° C. wherein the etchant is directed onto the copper at a rate of about 0.75 ml/minute, and wherein the substrate is rotated at a rate of 90–2000 RPM.

14. The process of claim 13, wherein the substrate is rotated at a rate of 2000 RPM, and the copper is removed at a rate of about 100–200 Å/min.

15. The process of claim 12, wherein the etchant is formed from solution containing 10–55 grams/liter of ammonium persulfate and maintained at a temperature of 25° C. to 55° C., wherein the etchant is directed onto the copper at a rate of about 0.1 liter/minute, and wherein the substrate is rotated at a rate of 300–1930 RPM.

16. The process of claim 15, wherein the etchant is formed from a solution containing 55 grams/liter of ammonium persulfate and maintained at a temperature of 25° C., wherein the substrate is rotated at a rate of 1930 RPM, and the copper is removed at the rate of 5600–6400 Å/min.

17. The process of claim 10, wherein the step of directing the etchant onto the copper is carried out by the process selected from the group of dripping and spraying.

18. The process of claim 10, wherein the field includes copper and at least one other metal.

19. A process for removing field metal composed of layers of different metals and a single metal above embedded metal from a substrate having at least one trench therein in which the embedded metal is located so as to produce an essentially planar surface comprising:

forming an etchant capable of etching the field metal and the metal above the embedded metal at a temperature in the range of 25° C. to 55° C.;
    rotating the substrate at a speed in the range of 90–2000 RPM; and
    directing the thus formed etchant onto the metal on the rotating substrate.

20. The process of claim 19, wherein a layer the field metal, the metal above the embedded metal, and the embedded metal is copper, the etchant is a 35% nitric acid solution at room temperature and is directed onto the copper at a rate of 0.75 ml/minute, and the substrate is rotated at a speed of about 2000 RMM;

whereby the copper is removed at a rate of about 100 Å to 200 Å/minute.

* * * * *